United States Patent [19]

Anacker

[11] 3,949,274

[45] Apr. 6, 1976

[54] PACKAGING AND INTERCONNECTION FOR SUPERCONDUCTIVE CIRCUITRY

[75] Inventor: Wilhelm Anacker, Kotanah, N.Y.

[73] Assignee: International Business Machines Corporation, Armonk, N.Y.

[22] Filed: May 30, 1974

[21] Appl. No.: 474,639

[52] U.S. Cl................... 317/101 A; 29/598; 29/626; 174/68.5; 317/101 CW; 317/101 D; 340/166 SC
[51] Int. Cl.²......................................... H01L 19/00
[58] Field of Search......... 357/5, 83; 174/52 S, 68.5; 317/101 A, 101 CC, 101 CM, 101 D, 101 DH, 101 CW; 339/17 LM:17 M; 307/212, 245, 306, 277; 340/147 SC, 166 SC; 29/626, 598

[56] References Cited
UNITED STATES PATENTS

| | | | |
|---|---|---|---|
| 2,904,768 | 9/1959 | Rasmussen | 339/17 LM |
| 3,340,440 | 9/1967 | Minter | 339/18 M X |
| 3,406,368 | 10/1968 | Curran | 339/17 M |
| 3,614,541 | 10/1971 | Farrand | 317/101 DH |
| 3,671,812 | 6/1972 | Peluso et al. | 317/101 CW UX |

Primary Examiner—Darrell L. Clay
Attorney, Agent, or Firm—Pollock, Vande Sande & Priddy

[57] ABSTRACT

A three dimensional micro electronic module packaged for reduced signal propagation delay times includes a plurality of circuit carrying means, which may comprise unbacked chips, with integrated superconductive circuitry thereon. The circuit carrying means are supported on their edges and have contact lands in the vicinity of, or at, the edges to provide for interconnecting circuitry. The circuit carrying means are supported by supporting means which include slots to provide a path for interconnection wiring to contact the lands of the circuit carrying means. Further interconnecting wiring may take the form of integrated circuit wiring on the reverse side of the supporting means. The low heat dissipation of the superconductive circuitry allows the circuit carrying means to be spaced approximately no less than 30 mils apart. The three dimensional arrangement provides lower random propagation delays than would a planar array of circuits.

19 Claims, 14 Drawing Figures

FIG. 2d
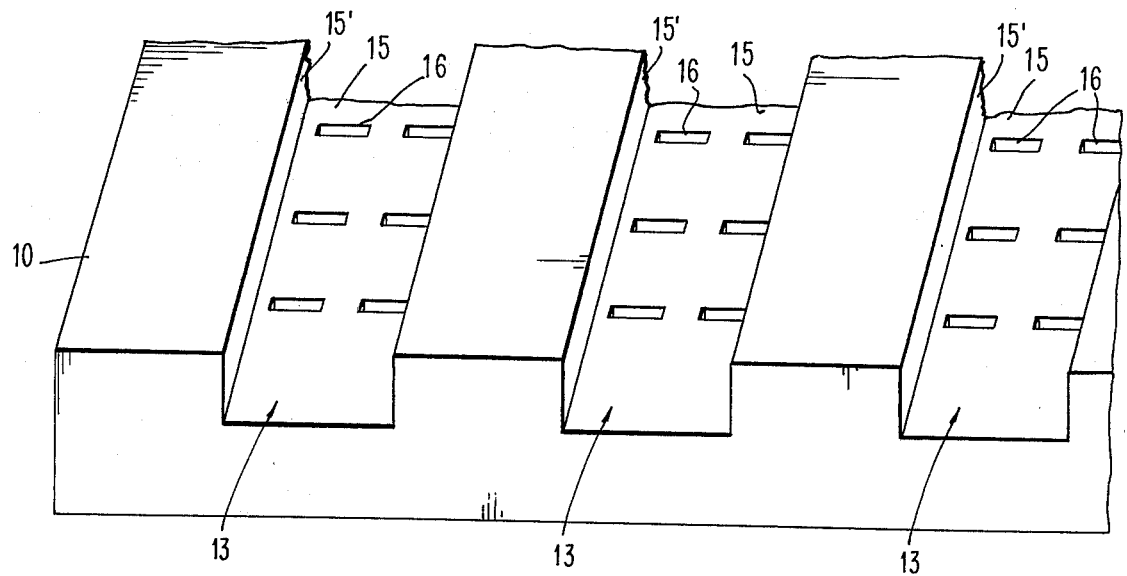
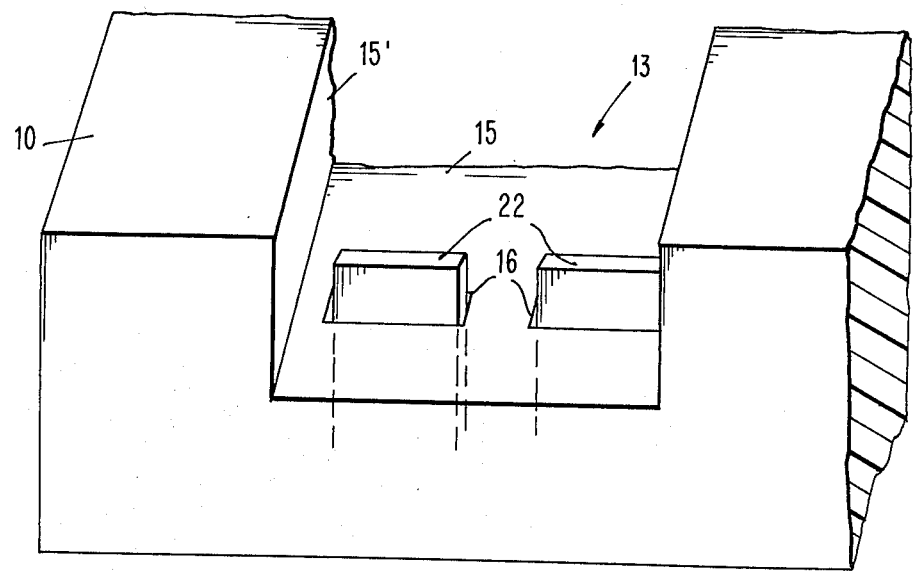
FIG. 2e

PACKAGING AND INTERCONNECTION FOR SUPERCONDUCTIVE CIRCUITRY

FIELD OF THE INVENTION

A packaging and interconnection arrangement for integrated circuits, particularly superconductive circuits which provide for reduced signal propagation delays.

BACKGROUND

For many yeart the packaging of electronic circuitry has been limited by two considerations: 1 the ease of interconnecting the electronic circuitry, and 2 the need to allow for sufficient heat dissipation in the packaged circuitry for long life operation. However, as the switching speed of electronic circuits became faster and faster, an additional constraing on circuit packaging was the need to reduce signal propagation delay times. Obviously, if a pulse has a rise time in the nanosecond range and it takes the pulse micro seconds to reach its intended destination, the pulse has not been effectively utilized. Fortunately, at about the same time that this factor became significant, integrated circuitry was introduced which greatly reduced the dimesions of electronic circuits. Thereafter, for much integrated circuit packaging the significant constraint was space necessary for heat dissipation and signal propagation delays were not significant.

However, with the advent of superconductive circuitry and Josephson tunneling devices, switching times have been decreased by a number of orders of magnitude. It had been reported that Josephson tunneling junctions can be switched in times in the order of $10^{-11}$ seconds. To effectively utilize such switching speed it becomes necessary to provide a circuit package or module, in which the signal propagation delays are not so long as to negate the tremendous advantages gained by such rapid switching. However, it is not merely a question of arranging a plurality of circuits or chips for reduced signal propagation delay times; but the need is to do so practically. The practical aspect of such a package requires that it be possible to make interconnections to circuits or chips of extremely small dimensions. The prior art teaches extensive planar arrays of integrated circuit chips and the means necessary to interconnect the same. However, these large planar arrays of integrated circuit chips are not suitable for superconductive circuitry, especially such circuitry employing Josephson tunneling devices. As has been referred to above, the extreme speed of the Josephson tunneling devices would not be effectively utilized in employing the prior art packaging techniques. The signal delay propagation times would be so long as to negate the effectiveness of the high switching speed of which these devices are capable.

SUMMARY OF THE INVENTION

It is therefore one object of the present invention to provide a packaging and interconnection arrangement for superconductive circuitry, especially such circuitry employing Josephson tunneling devices therein which can provide for reduced signal propagation delay times.

It is another object of this invention to provide a packaging and interconnection arrangement for superconductive circuits and chips of extremely small dimensions.

It is another object of the present invention to provide a three dimensional module of integrated circuitry to thus minimize the propagation delay times for signals traveling between circuits contained therein.

It is still a further object of the present invention to provide packaging and interconnection arrangement in which unbacked chips are supported on their edges, with contact lands in the vicinity of the edges for interconnection purposes.

It is still a further object of the present invention to provide for the foregoing in which the unbacked chips are supported on supporting means which have slots therein allowing interconnection means, deposited on one surface of the supporting means to make contact with the contact lands of the chips.

A still further object of the present invention is to provide an arrangement such as the foregoing, which has grooves in one of the surfaces of the supporting means with the circuit carrying means, on their edges, being supported in the grooves.

Another object of this invention is to provide the foregoing arrangement with slots cut into the grooves to provide a path for interconnection wiring connected to the contact lands.

Other objects, features, and advantages of this invention will become apparent from the reading of this specification taken in conjunction with the accompanying drawings.

BRIEF DESCRIPTION OF THE DRAWINGS

In the drawings:

FIG. 2d is a representation of a substrate which forms a supporting means by having been shaped in accordance with the preseent invention;

FIG. 2e is similar to FIG. 2d but on an enlarged scale;

DETAILED DESCRIPTION OF THE INVENTION

Figure 1:
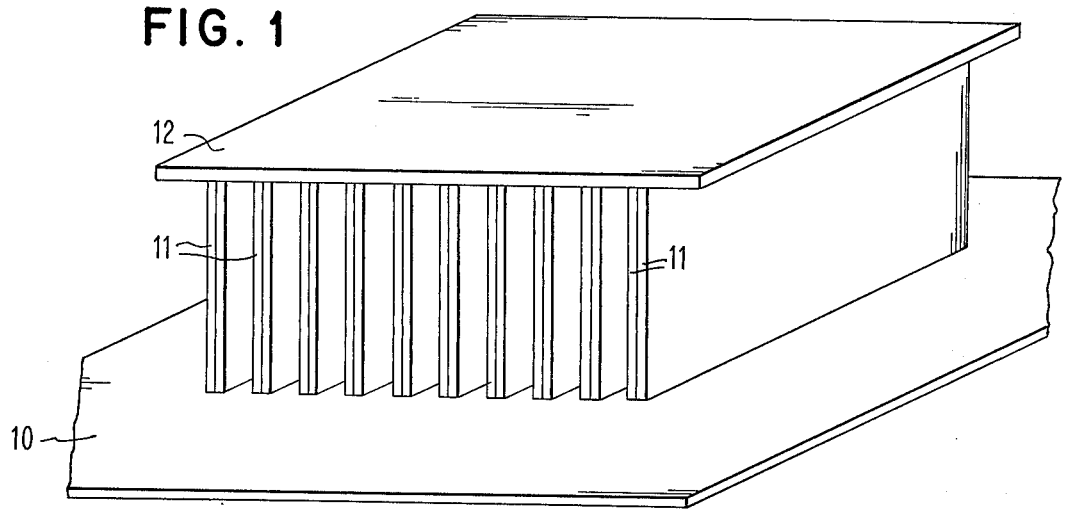
FIG. 1 is a representation of a three-dimensional micro-electronic module constructed in accordance with the present invention.

FIG. 1 shows a three-dimensional micro-electronic module packaged for reduced signal propagation delay times and built in accordance with principles of the present invention. In FIG. 1, 10 is a supporting means which supports, on one surface thereof, a plurality of circuit carrying means 11. The plurality of circuit carrying means 11 are oriented parallel to one another in spaced apart relationship, and perpendicular to the surface of the supporting means 10 on which the circuit carrying means 11 are supported. Each of the circuit carrying means 11 has a length, width and depth and is supported on one of its four edges by one surface of a supporting means 10. The particular supporting arrangement will be described later. A second edge of each of the circuit carrying means 11, opposite to the edge of the circuit carrying means 11 which contacts the supporting means 10, is in contact with a second supporting means 12. The second supporting means 12 lies in generally a parallel relationship with the supporting means 10 and is spaced therefrom by a distance which is substantially equal to the width of each of the circuit carrying means 11.

As shown in FIG. 1, and in accordance with one preferred embodiment of the present invention, each of a pair of the circuit carrying means 11 may be disposed in closely spaced relationship to the other of the pair, as compared with the distance between pairs of circuit carrying means 11. Each of the circuit carrying means 11 carries, on one surface thereof, integrated circuit means which may be superconductive circuitry and which may include Josephson tunneling devices. As can be seen from FIG. 1 the module is three-dimensional in that the circuits on each of the circuit carrying means 11 extend in two dimensions and the plurality of circuit carrying means 11 extend in a third direction. The interconnection from circuits on one circuit carrying means to the next can be effected by interconnection means which are carried on the supporting means 10 and 12. The particular arrangement of these interconnection means will become apparent as this description proceeds. For heat dissipation purposes it is necessary that the heat generated in the integrated circuits be carried away by the medium in which the module exists. In the case where the circuitry is superconductive, these modules would be in a liquid helium, a liquid nitrogen, or equivalent bath and thus the distance between pairs of circuit carrying means 11 should be sufficient for the medium to circulate freely to thus carry away the generated heat. To that end, pairs of circuit carrying means 11 can be separated by a distance which may be approximately no less than 30 mils. Other typical dimensions of the circuit carrying means 11 include a length, that is a horizontal dimension of 300 mils and a width, or a vertical dimension of 240 mils.

Before describing the manufacturing method it will be helpful to define some terms. In integrated circuit technology manufacturing begins with a wafer of suitable material. The wafer is the base on which material is deposited to form integrated circuit components and conductors. Usually a single wafer will have a repeating pattern of different materials deposited thereon. After deposition and processing the wafer is cut to form a plurality of integrated circuits which are termed "chips". The base of the chip is the original wafer and is termed the "substrate". In addition, the term "module", as used herein, refers to a plurality of chips which are electrically and mechanically combined as a unit. Usually a module will have an interconnection portion, such as pins or the like, for connecting the module to a circuit card or the like.

Figure 2A:
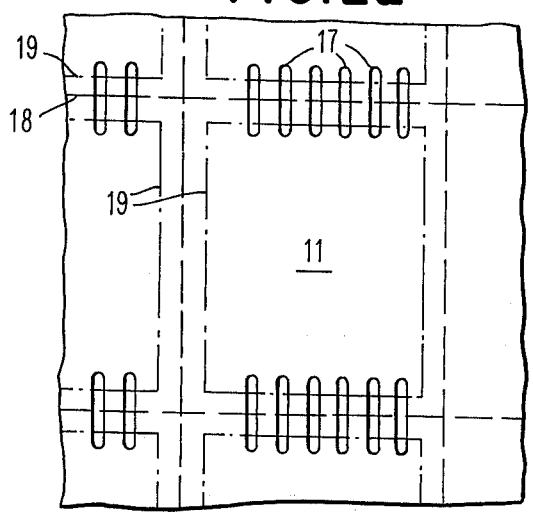
FIG. 2a is a plan view of a portion of a substrate which has been slitted in accordance with the present invention.
Figure 2B:
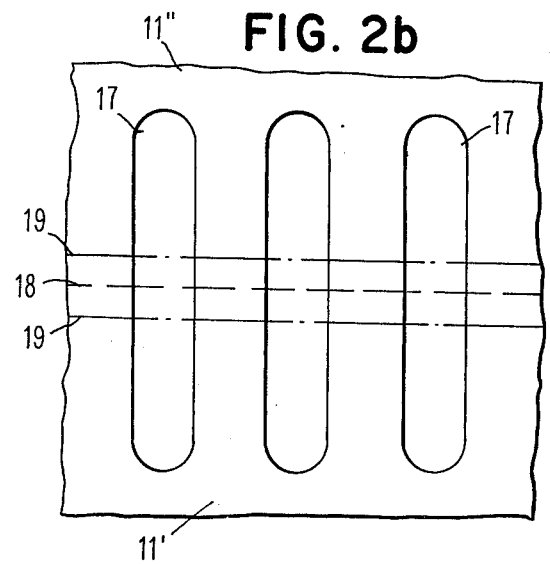
FIG. 2b is a plan view similar to FIG. 2a but on an enlarged scale.
Figure 2C:
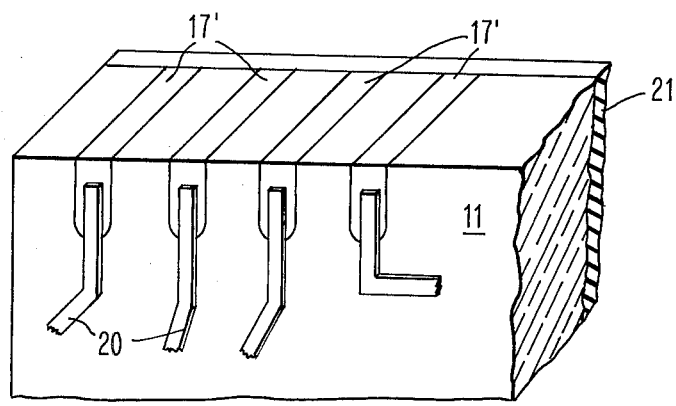
FIG. 2c is a representation of a portion of a micro-electronic chip with contact lands thereon in accordance with the present invention.

One preferred embodiment is further illustrated in FIGS. 2a through 2g. In this embodiment each of the circuit carrying means 11 comprises an unbacked chip carrying integrated circuit means on one surface thereof. Describing this form of the invention, the manner in which each of the chips can be fabricated will first be discussed, including the steps necessary to fabricate the contact lands. FIG. 2a illustrates a portion of a suitable wafer which can form a substrate for a typical chip. The wafer may comprise silicon or glass or other suitable material. Before the chips are cut out a series of slits 17 are cut into the wafer. The slits 17 are cut in parallel rows with the distance between the rows of slits approximately equal to one dimension of the chips which will eventually be cut from the illustrated wafer. Furthermore, the slits need not be cut completely through the wafer, that is, they may only be cut partially through the wafer. FIG. 2a also illustrates the chip cut lines 18 and the chip boundaries 19 formed as a result of cutting along the chip lines 18. The lines 18 and 19 are illustrated in FIG. 2a for explanatory purposes only as the slits 17 are formed into uncut wafers. The lines 18 and 19 are helpful, however, in showing that each slit 17 is cut into what will form edges of two chips. FIG. 2b 108 illustrates in greater detail the form of the slit 17 in relation to the cut line 18 and the chip boundaries 19. To that end, FIG. 2b illustrates portions of what will become two chips, referred to as 11' and 11''. Typically, the slits can be 20 mils in length, and 1½ mils in width and spaced on 3½ mil centers. The distance between the parallel rows of slits 17 is thus determined by the desired size of the chips 11. The particular process to cut the slits may comprise electron beam drilling and/or etching. Subsequent to the drilling or etching of the slits 17 the slits may be at least partially filled with a low melting superconductive Pb-alloy solder or other suitable material to form contact lands. At this point the wafer has a number of parallel rows of contact lands 17'. The wafer surfaces are now polished to provide sufficiently flat surfaces for vacuum deposition and photolithographic pattern definition. A 1 mil thick insulating film or the equivalent may then be deposited on one surface of the wafer which will then become the back surface. If the slits are cut completely through the wafer this insulating surface will then insulate the contact lands at that surface. At this point integrated circuit means, which may comprise superconducting circuitry, which may also include Josephson tunneling circuits, can then be deposited onto the front surface, the surface opposite the insulated surface, of the wafer. The now filled slits 17 will serve as contact lands for the integrated circuit means. After the integrated circuit means are deposited on the wafers, the wafers can be cut along the lines 18 to thus provide a plurality of chips 11. After the cutting, the chips will take the form illustrated in FIG. 2c. The superconductive circuitry 20 is provided on one surface of the chip with an insulating layer 21 on the opposite surface. The filled slits 17' now provide a series of contact lands at regularly spaced intervals on two parallel edges of the chip. FIG. 2c illustrates only one of the chip edges with its contact lands connected to the superconductive circuitry 20.

FIG. 2d illustrates the supporting means 10 which may comprise a wafer which may typically be 20 mils thick. This wafer should be either the same material as that forming the chip substrate or a material with a similar coefficient of expansion. Into this wafer a series of grooves 13 are cut. The grooves are formed with a lower surface 15 parallel to the upper surface of the wafer and two lateral surfaces 15' as illustrated in FIG. 2d. These grooves may be 20 mils in width, that is 20 mils between the lateral surfaces 15'. The grooves may be 10 mils deep, that is the surface 15 is 10 mils below the upper surface of the supporting means 10. Furthermore, the grooves may be on 45 mil centers. In order to produce the grooves, machining or pressing can be employed. After the grooves are formed two rows of slots 16 are cut into the lower surface 15 of each of the grooves. Each of these slots 16 may be 5 mils in length, one mil wide and on 3½ mil centers and cut through the supporting means. This operation can employ electron beam drilling or etching. As illustrated in FIG. 2d, the long dimensions of the slot and the grooves are perpendicular to each other. On the ungrooved side of the supporting means 10 the wafer is polished to provide a suitably flat surface for a photolithographic processing of interconnecting means. The interconnection means may take the form of deposited integrated circuit wiring which may comprise superconducting films for interchip wiring purposes.

Figure 2F:
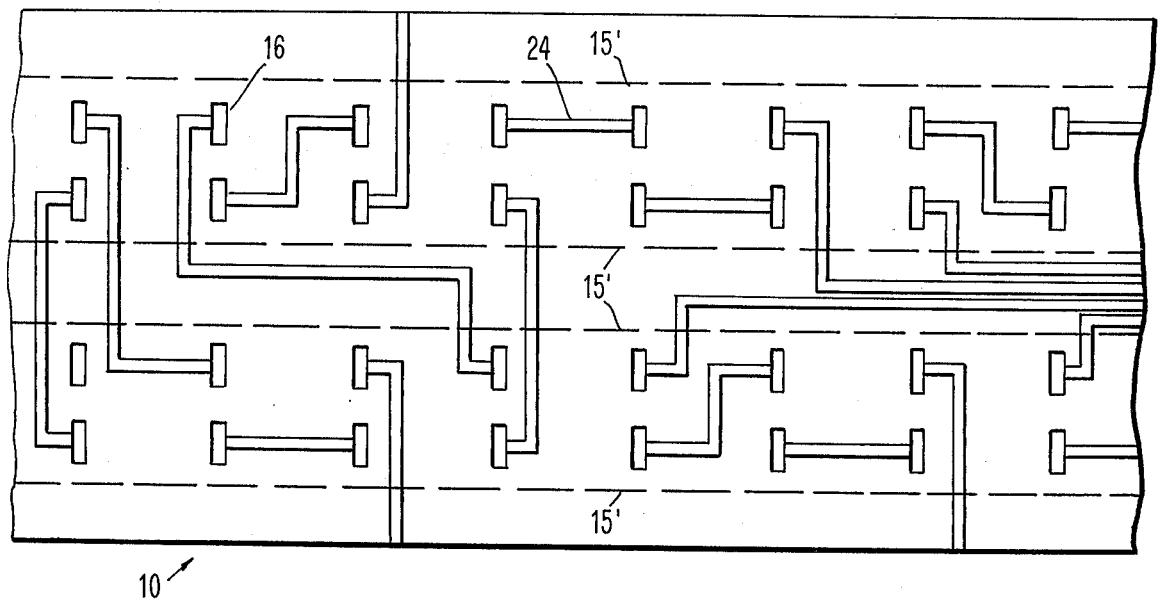
FIG. 2f is a plan view of one surface of a substrate which forms a supporting means.

FIG. 2f illustrates the reverse side of the supporting means 10, i.e., the surface opposite the upper surface. In FIG. 2f the lateral surfaces of the grooves are shown at 15' and the slots 16 are also shown. The interconnection means 24 is illustrated as a pattern of superconductive circuitry on the reverse side of the supporting means 10. The use of superconductive wiring for the interconnection means is nonessential although it may be desirable. After the grooves, slots, and integrated circuit wiring are provided in the wafer, the wafer can be cut to suitable size to form a number of supporting means 10.

FIG. 2e illustrates an enlarged portion of a supporting means 10 showing one groove therein with a lower surface 15 and a pair of lateral surfaces 15'. Only one pair of slots 16 is illustrated in the portion of the supporting means 10 shown in FIG. 2e. Into each of the slots 16 an N*b* or other suitable contact foil 22 is provided. This foil is dimensioned commensurate with the dimensions of the slots 16 and typically it may be 4 mils in width, 14 mils long, and 10 microns thick. The foil is positioned into the slot 16 so that it protrudes into the groove above the lower surface 15 thereof by about 4 mils. The edge of the foil 22 which extends to the ungrooved surface or reverse side of the supporting means 10 becomes a portion of the interconnection means by making galvanic contact with the interconnection means 24 deposited on the ungrooved surface of the supporting means 10.

Figure 2G:
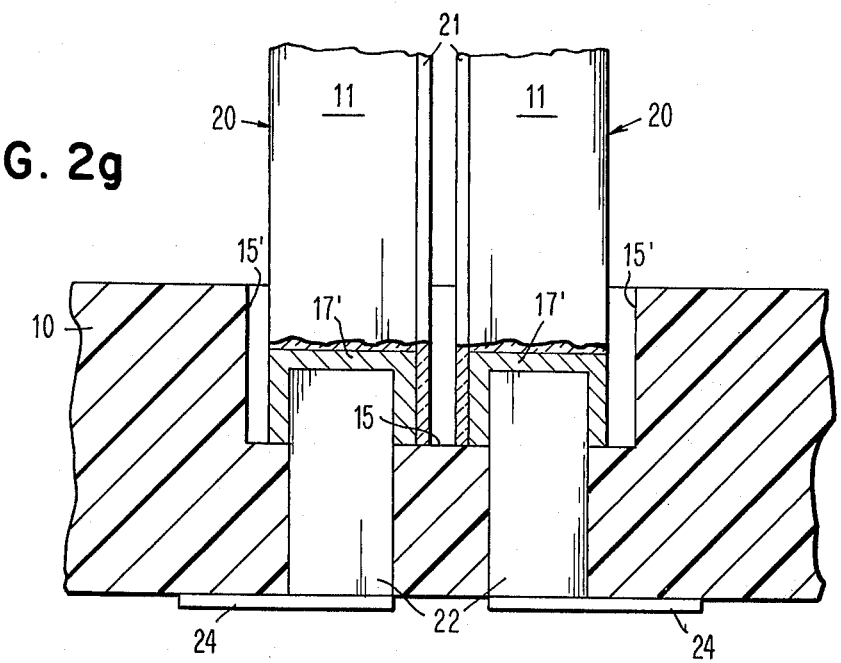
FIG. 2g is a cross-section of a supporting means with a circuit carrying means which may be a chip mounted therein.

When the supporting means 10 has been thus prepared the chips 11 may be mounted therein as illustrated in FIG. 2g. FIG. 2g is a cross-section of a supporting means 10 with a pair of chips 11 mounted in one groove thereof. The cross-section is taken to show only one of the contact lands 17' in each of the chips 11. As illustrated in FIG. 2g the interconnection means 24 on the ungrooved surface of supporting means 10 makes contact with the foils 22. Each of the chips 11 has superconductive circuitry 20 on one surface thereof and the insulating layer 21 on the opposite surface. Furthermore, as illustrated in FIG. 2g the contact lands 17' make contact with the foils 22. This contact can be effected by a solder reflow technique. Using this technique, the supporting means 10 and chips 11 are heated so that the solder filling the contact lands 17' flows about the foils 22 making good electrical contact therebetween.

It will be appreciated that the typical dimensions that have been given may be varied within the principles of the present invention. What is important is that the center to center distance of the contact land 17' on each of the chips is the same as the center to center distance of the slots 16 which are cut into the grooves. Furthermore, the width of the grooves, that is the distance between adjacent lateral surfaces 15' should be sufficient to accommodate the depth of the chips 11 that are to be mounted therebetween. To that end, FIG. 2g illustrates a pair of chips in each groove. However, that is not necessary, as it may be sufficient to provide only a single chip in each groove and thus the distance between lateral surfaces 15' could be reduced. Furthermore, the distance between a lateral surface 15' of a groove and the adjacent lateral surface 15' of the next groove should be sufficient so that in the environment in which the module will operate the heat generated by the module can be dissipated. The typical dimensions given here allow approximately 30 mils between the integrated circuitry on the one chip 11 in one groove and the next chip in an adjacent groove. The spacing between chip surfaces 21 need not allow circulation of a cooling medium.

Referring again to FIG. 1, it will be appreciated that the upper surface of the supporting means 10, as illustrated in FIG. 1, is the surface into which the grooves are cut while the opposite surface of the supporting means 10, as illustrated in FIG. 1, has the interconnection means deposited thereon. Furthermore, the chips 11 are supported on their edges, at which edges the contact lands are provided. The supporting means 12, illustrated in FIG. 1 as above chips 11, may be formed as a mirror image of the supporting means 10. That is, the lower surface of the supporting means 12 may have grooves therein and the interconnection means 24 may be provided on the upper surface of the supporting means 12. Furthermore, the supporting means 12 may be formed of the same material as is the supporting means 10.

In another embodiment of the present invention the grooves 13 may be dispensed with. In this embodiment which is illustrated only in FIG. 1, the slots 16 will extend through the entire thickness of the supporting means 10. Correspondingly, the foils 22 may well have to be increased in length so that their length is approximately 4 mils greater than the thickness of the supporting means 10 and 12. In this embodiment, the chips 11 are prepared in the same manner as were the chips illustrated in FIGS. 2b through 2g. The slots are cut into the supporting means 10 and 12 in much the same manner as the slots are cut into the supporting means illustrated in FIGS. 2a through 2g. The only difference between these two embodiments is that the grooves are not provided. The grooves serve to locate and mechanically stabilize the module. However, this may not be necessary in actual practice and thus the grooves may be dispensed with.

In either of the embodiments illustrated in FIG. 1, the area of the supporting means 10 over which the chips 11 are mounted is utilized for the deposition of interconnecting means providing interchip wiring. FIG. 1 illustrates, however, that the supporting means 10 has area outside of this portion. This area may be provided with pins or other connecting means for readily connecting the module illustrated in FIG. 1 to a printed circuit card. Those with ordinary skill in the art will readily understand that other interconnection means, aside from the pins mentioned above, may be provided.

Figure 3:
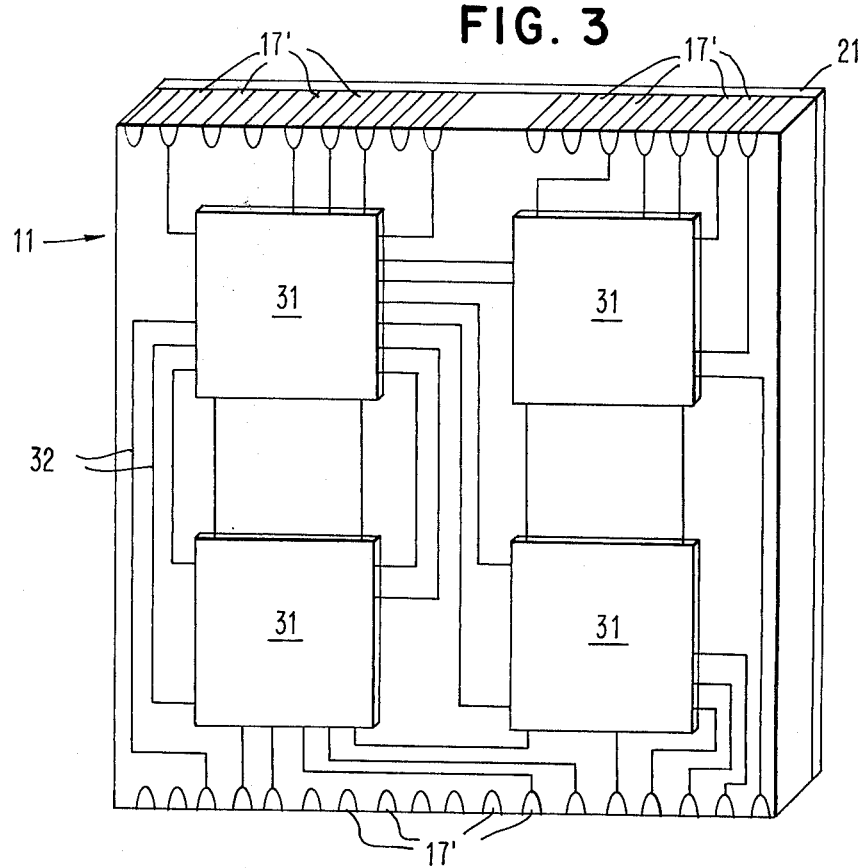
FIG. 3 is a representation of a circuit carrying means in accordance with one preferred embodiment of the present invention which supports a plurality of chips.

Another preferred embodiment of the present invention is illustrated in FIGS. 1 and 3. In this embodiment, the circuit carrying means 11 do not comprise a single chip. In this embodiment, FIG. 3 illustrates the circuit carrying means 11.

In particular, it will be seen that the circuit carrying means 11 has a plurality of contact lands 17' on two edges thereof, much in the same manner as the circuit carrying means 11 illustrated in FIG. 2. However, the circuit carrying means 11, of FIG. 3, further comprises a plurality of chips 31 mechanically and electrically mounted thereon. Although in FIG. 3 four chips 31 are illustrated as being supported by the circuit carrying means 11, those with ordinary skill in the art will understand that the number of chips on each of the circuit carrying means 11 may be varied to suit the circumstances. Second interconnection means 32 provide interconnection circuitry between the contacts of the various chips 31 and the contact lands 17' on the circuit carrying means 11. Preferably, the second interconnection means 32 may comprise superconductive wiring deposited on the surface of the circuit carrying means 11, in a conventional manner. The chips 31 may be mechanically mounted to the circuit carrying means 11 by a solder reflow technique. Typically the chip 31 is mounted on circuit carrying means 11 so that the integrated circuitry is facing the circuit carrying means 11.

The fabrication of the circuit carrying means 11, illustrated in FIG. 3, may be carried out as follows. A wafer is proved with a plurality of slits 17, as illustrated in FIGS. 2a and 2b. One surface of the wafer may then be polished to provide a suitable surface for the deposition of insulating layer 21. In this embodiment, however, the insulating layer 21 may not be necessary and may, under certain circumstances, be omitted. The opposite surface of the wafer may then be polished and prepared for mechanical and electrical interconnection of a plurality of chips 31 thereon. This may take the form of employing conventional flip-chip techniques. At the same time, a second interconnection means 32 may be deposited on the same surface of circuit carrying means 11 to which the chips 31 are to be mounted. At this point, the wafer may then be cut so as to provide a plurality of circuit carrying means 11. The material chosen for use of a contact land is then provided in the portions of the slits 17 which remain in the circuit carrying means 11 so as to provide the plurality of contact lands 17' illustrated in FIG. 3. At this point, the chips 31 will then be mechanically and electrically attached to the circuit carrying means 11 to thus provide a circuit carrying means 11, as illustrated in FIG. 3.

The circuit carrying means 11, illustrated in FIG. 3, cooperates with supporting means 10 and 12 in order to form a micro-electronic circuit module. The supporting means 10 and 12 may take the form illustrated in FIG. 1. In providing the supporting means 10 and 12 either the grooved or ungrooved type of supporting means 10 and 12 may be utilized with the circuit carrying means 11, illustrated in FIG. 3. The manner of preparation of the supporting means 10 and 12 and the joining of circuit carrying means 11 with the supporting means 10 and 12 take the form which has previously been discussed with respect to previously disclosed embodiments. No further discussion thereof appears necessary.

Figure 4A:
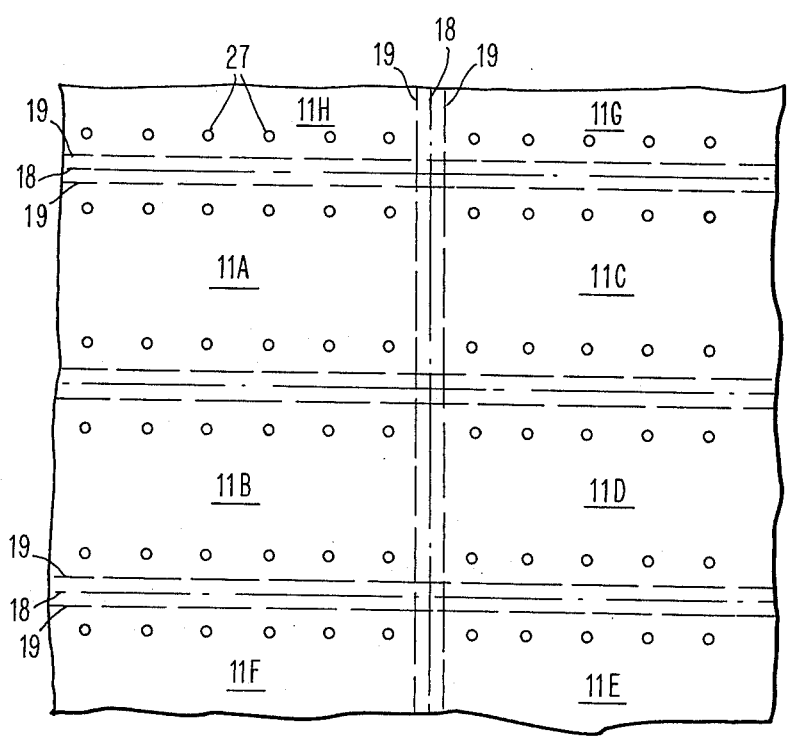
FIG. 4a is a plan view of a substrate which has been slitted to provide for contact lands.
Figure 4B:
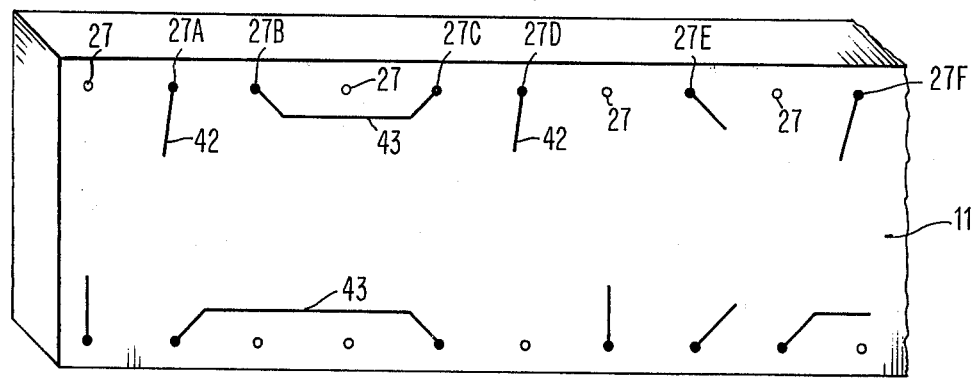
FIG. 4b is a representation of a portion of a circuit carrying means constructed in accordance with another preferred embodiment of this invention.
Figures 4C, 4D:
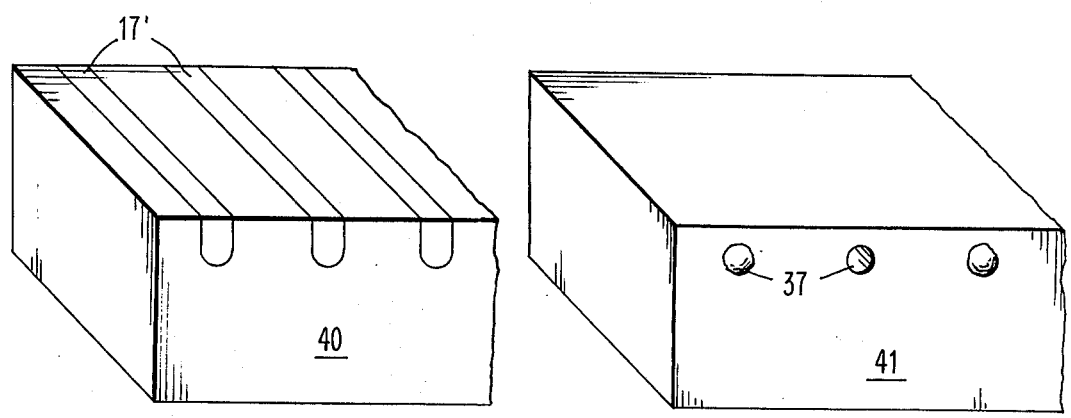
FIG. 4c is a representation of a portion of a supporting means in accordance with a preferred embodiment of this invention.
FIG. 4d is a representation of a portion of a supporting means in accordance with still another preferred embodiment of this invention.
Figure 4E:
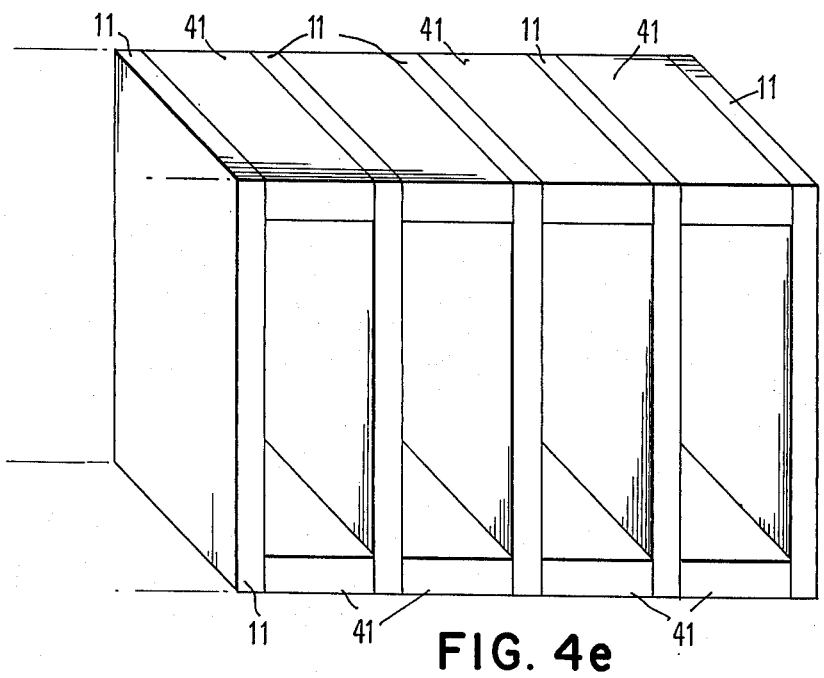
FIG. 4e is a representation of a three-dimensional micro-electronic module according to a preferred embodiment of this invention.

Still another preferred embodiment of the present invention is illustrated in FIGS. 4a, 4b, 4c, 4d, and 4e. The assembled module in accordance with this embodiment of the invention is illustrated in FIG. 4e. FIG. 4e shows a plurality of circuit carrying means 11 held in spaced apart parallel relationship by a plurality of supporting means 41. Each of the circuit carrying means 11 supports integrated circuit means on at least one surface thereof. The integrated circuit means supported by the circuit carrying means 11 are electrically connected to a plurality of contact lands on each of the circuit carrying means 11. Interconnection means associated with the supporting means 41 provide interconnection capability between the various circuit carrying means 11. The supporting means 41 further provides mechanical support for circuit carrying means 11 and supporting means 41 into a mechanically unitized module. It will be seen that the module illustrated in FIG. 4e is three dimensional in that the integrated circuit means associated with any one of circuit carrying means 11 extends in two dimensions. Furthermore, the plurality of circuit carrying means 11 extends in a third dimension, perpendicular to the dimensions previously referred to. As has been explained above, the three dimensional module provides for reduced propagation delays for signals traveling among the circuits carried by the plurality of circuit carrying means 11.

The integrated circuit means carried by the circuit carrying means 11 may comprise superconductive circuitry, that is, circuitry which is superconductive at an operating temperature. In order to provide the proper environment for the operating temperature, as is well known to those skilled in the art, the module may be immersed in a liquid helium, liquid nitrogen or equivalent bath. In order to allow the bath in which the module is immersed to intimately contact each of the circuit carrying means 11, the supporting means 41 has a further function of spacing the circuit carrying means 11 one from another so that the bath may circulate between spaced circuit carrying means 11. The circulating bath further provides for carrying away the heat dissipated by the integrated circuit means carried by the circuit carrying means 11. In order for the circulating bath to properly perform its function, the distance between adjacent circuit carrying means 11 should be no less than approximately 30 mils.

In order to illustrate the manner in which the integrated circuit means are interconnected reference is made to FIGS. 4a and 4b which show the fabrication of the circuit carrying means 11, and also to FIGS. 4c and 4d which show two different embodiments of the supporting means. Generally, the circuit carrying means 11 include a plurality of contact lands in the vicinity of two of the edges of the circuit carrying means 11, as illustrated in FIG. 4b. The supporting means 41 includes a number of conductors imbedded in the supporting means 41, as illustrated in FIG. 4d to provide for interconnection between contact lands of one circuit carrying means 11 and contact lands of another circuit carrying means 11.

FIG. 4a illustrates the manner in which the circuit carrying means and in particular the contact lands thereof, are fabricated. FIG. 4a illustrates a wafer which has a plurality of holes 27 cut therein. The holes 27 are cut in a number of parallel rows. The spacing or distance between the parallel rows of holes 27 is regular, although not equal. FIG. 4a illustrates in addition to the holes 27 in the wafer, cut lines 18. After the wafer has been prepared as will be discussed hereinafter, it is cut on the lines 18 to form a plurality of circuit carrying means 11. The boundaries of the circuit carrying means 11 formed when the wafer is cut on the cut lines 18 are illustrated by boundaries 19. The wafer is cut so that the rows of holes form holes in two edges of the circuit carrying means 11. To more clearly illustrate this the wafer illustrated in FIG. 4a has been divided up into a plurality of circuit carrying means referred to as 11A through 11E. It should be understood that this is merely for purposes of explanation as after the rows of holes 27 have been cut, the wafer must be suitably prepared prior to actually separating the wafer into a plurality of circuit carrying means 11. The spacing of rows of holes 27 is determined by whether or not the two rows of holes are in areas of the wafer which will form one circuit carrying means 11, or whether the rows are cut into the areas of the wafer which will form different circuit carrying means 11. Reference to FIG. 4a shows that, for instance, the row of holes 27 in areas which will form circuit carrying means 11H or 11G is relatively closely spaced to the row of holes 27 cut into the area of the wafer which will form circuit carrying means 11A and 11C. In contrast, however, the rows of holes 27 which are cut into the area of the wafer which is to become circuit carrying means 11A and 11C are relatively more distant from each other. The holes 27 may typically be 1 mil in diameter and spaced a suitable distance apart, such as no less than 3.5 mils. The particular method by which these holes 27 are formed could comprise electron beam drilling and/or etching. In contrast to the formation of contact lands in other embodiments of this invention, these holes 27 must be cut completely through the wafer. After the holes have been formed the surfaces of the wafer are polished and then an insulating layer may be deposited on one surface of the wafer. If an insulating layer is used, it is essential that the insulating layer not insulate any portion of the holes 27 and thus it may be desirable to form the holes 27 after the insulating layer has been deposited. The holes 27 may then be filled with a suitable material such as a superconductive Pb alloy. These now-filled holes 27 comprises contact lands. The integrated circuitry may now be deposited upon the surface of the wafer opposite the surface which carries the insulating layer. The integrated circuitry which is deposited on the wafer is galvanically connected to the contact lands 27. At this point in the processing the wafer is cut on the cut lines 18 to form a plurality of circuit carrying means 11 with integrated circuitry on one surface thereon and such circuitry being connected to the contact lands 27. One such wafer is illustrated in FIG. 4b with the actual circuitry pattern omitted. FIG. 4b further illustrates that some of the holes 27 may be left open, that is, not filled with a conductive material. For explanatory purposes one row of holes 27 shown in FIG. 4b has been labeled. The contact lands 27A through 27F are all filled with conductive material to form six contact lands. To the contrary, however, the holes identified as 27, in FIG. 4b, are open and thus do not form contact lands. Furthermore, two contact lands in a row such as contact lands 27B and 27C may be interconnected such as by integrated circuit wiring 43 as illustrated in FIG. 4b, for interconnection purposes.

To provide interconnections between the integrated circuit means carried on one circuit carrying means 11 with the integrated circuit means carried on another circuit carrying means 11, supporting means 41 is provided. A typical portion of a supporting means 41 is illustrated in FIG. 4d. As has been mentioned above, the depth or thickness of the supporting means 41 determines the spacing between adjacent circuit carrying means 11. Therefore, the thickness of supporting means 41 is chosen to be no less than approximately 30 mils to provide for sufficient space between adjacent circuit carrying means 11 for cooling purposes. The material of the supporting means 41 may comprise the same material which forms the substrate of the circuit carrying means 11 of a material of like thermal coefficient. Supporting means 41 has a plurality of holes 37 cut therethrough and filled with a suitable conductive material such as the Pb alloy referred to above. The holes 37 are similar in dimension to the holes 27 in the circuit carrying means 11 and are spaced apart in the same manner as the holes 27 are spaced apart. The length of the supporting means 41 is determined to be equal to the length or the width of the circuit carrying means 11. It should be noted that it is not necessary to fill with conductive material each of the holes 37 in the supporting means 41. For much the same reasons as some of the holes 27 were left open, some of the holes 37 may be left unfilled and thus non-conductive.

An alternative form of a supporting means is illustrated in FIG. 4c. FIG. 4c illustrates supporting means 40 which comprises the same material as is the supporting means 41 and of the same length, width and depth. However, the conductors imbedded in the supporting means 40 are formed in much the same manner as the contact lands are formed in the chip illustrated in FIG. 2c. In this embodiment, moreover, it is necessary that the size and shape of the lands 17' be so determined that, when the supporting means 40 is located adjacent to circuit carrying means 11, the lands 17' conductively engage the lands 27. To that end the vertical dimension (as shown in FIG. 4c) of the lands 17' should be greater than the distance between lands 27 and the edge of the circuit carrying means 11.

Now that the form of the circuit carrying means 11 and the supporting means has been described, the manner in which the parts of the module of FIG. 4e cooperate with one another will be clearly understood. Each of a pair of circuit carrying means 11 is spaced apart by a pair of supporting means 40 or 41. In the fabrication process, after the circuit carrying means 11 and the supporting means have been prepared, they are joined by a solder re-flow technique for good electrical and mechanical connections. A proper choice of open holes 27 and/or open holes 37 enables a particular interconnection circuit to stop or start at any desired interface between a circuit carrying means 11 and a supporting means. Furthermore, since the contact lands 27 on a circuit carrying means 11 may be interconnected, as illustrated in FIG. 4b, a great amount of flexibility is provided to the designer.

Although in the above description of the circuit carrying means 11 illustrated in FIG. 4b, mention has been made that the integrated circuit means is deposited on one surface of the circuit carrying means 11, it is within the scope of the present invention to provide in the embodiment of FIGS. 4a through 4e, a circuit carrying means 11 as illustrated in FIG. 3. More particularly, the circuit carrying means 11 may carry integrated circuit chips thereon with the integrated circuitry actually deposited on the chips. In this form of the invention the integrated circuit wiring deposited on the circuit carrying means 11 itself will perform the function of the interconnection wiring 32 illustrated in FIG. 3.

To provide for interconnecting modules such as that illustrated in FIG. 4e, at least two alternative arrangements are available. A particular circuit carrying means 11 at one end of the module may be provided with pins for interconnection with a circuit card as is well known to those skilled in the art. The pins may extend completely through the circuit carrying means 11 and contact integrated wiring on the surface of the circuit carrying means 11 opposite the surface through which the pins extend. Alternatively, one, or a plurality of supporting means 41, may be provided with a like arrangement of pins. Other conventional interconnection techniques may also be suitably employed with either one of the circuit carrying means 11 or one or more of the supporting means 41 to provide for interconnection between the plurality of modules.

The foregoing invention has provided a three-dimensional micro-electronic module which is arranged for reduced signal propagation delays. Furthermore, the interconnection arrangement and the form of the components of the module have been selected so as to provide practical techniques to interconnect the integrated circuitry within the module. To that end, circuit carrying means have been disclosed which have contact lands either at the edges thereof, or in the vicinity of the edges which cooperate with supporting means for mechanically supporting the circuit carrying means; the supporting means further providing for interconnection means between the integrated circuits of various circuit carrying means. In addition, for module-to-module interconnection, arrangements have been made for connecting the circuits housed in a module into a circuit including other modules. Those with ordinary skill in the art, from a reading of the above specification, will readily be capable of varying some of the parameters disclosed above. The invention should not be limited by typical dimensions and the like disclosed herein but the claims appended to the specification define the invention.

What is claimed is:

1. A three-dimensional micro-electronic module of superconductive circuitry packaged for reduced signal propagation delay times comprising:
    a plurality of superconductive integrated circuit chips, having length, width and depth, each of said chips having superconductive circuitry on at least one surface thereof and having contact lands in the vicinity of at least one of the edges of said surface interconnected to said circuitry,
    at least one supporting means having length, width and depth supporting said chips at said edges of said chips,
    said supporting means including means interconnecting said superconductive circuitry of different ones of said chips to one another via said contact lands, said one surface of each of said chips lying in a plane different from the plane of any other said one surface of any other of said chips.

2. The module of claim 1 in which said means interconnecting said circuitry includes integrated circuit wiring deposited on one surface of said supporting means.

3. The module of claim 2 in which said supporting means further includes,
    a plurality of parallel grooves in a surface thereof parallel to said one surface, said grooves having a width greater than the depth of said chips, and said chips being supported with said edges lying in said grooves.

4. The module of claim 3 in which said supporting means further includes slots extending from grooved surface to said one surface and said means interconnecting said circuitry extends through said slots contacting said contact lands of said chips.

5. The module of claim 4 in which said circuit wiring on said one surface of said support means is superconductive at said operating temperature.

6. The module of claim 4 in which said grooves are spaced one from another by a distance sufficient for dissipating heat generated by said circuitry.

7. The module of claim 6 in which said distance is no less than approximately 30 mils.

8. The module of claim 6 in which each of said grooves has a width greater than twice the depth of said chips.

9. The module of claim 2 in which said supporting means further includes slots extending therethrough from a second surface of said supporting means which is parallel to said one surface to said one surface,
    said means interconnecting said superconductive circuitry extends through said slots and contacts said contact lands of said chips.

10. The module of claim 9 in which said slots are spaced with a center-to-center distance equal to the center-to-center spacing of said contact lands of said chips.

11. The module of claim 10 in which said circuit wiring is superconductive at said operating temperature.

12. The module of claim 2 which includes second supporting means parallel to and spaced from said supporting means and contacting second edges of said chips.

13. The module of claim 12 in which said supporting means has,
    a plurality of parallel grooves in a surface thereof which is parallel to said one surface,
    and a plurality of parallel grooves in said second supporting means,
    said grooves in said supporting means having a width greater than the depth of said chips,
    said grooves in said second supporting means having a width greater than the depth of said chips,
    said chips having said edges in said grooves of said supporting means and said second supporting means.

14. The module of claim 13 in which said grooves of said supporting means are spaced with a center-to-center spacing of no less than 30 mils and
    said grooves of said second supporting means are spaced with a center-to-center spacing of no less than 30 mils.

15. The module of claim 1 in which said contact lands comprise a plurality of parallel holes extending through said chips from said one surface to another surface parallel to said one surface, conductive material enclosed in said holes, and said supporting means includes insulating material having a width equal to the width of said chips surrounding a plurality of contacts equal in depth to the depth of said insulating material and spaced apart a distance equal to the spacing of said contact lands of said chips.

16. The module of claim 15 in which said contacts are located between some of adjacent ones of said chips.

17. The module of claim 16 in which the depth of said insulating material of said contacts is equal to the distance between adjacent ones of said chips which distance is at least equal to a distance sufficient for heat dissipation purposes.

18. The module of claim 16 in which said distance separating adjacent ones of said chips is no less than 30 mils.

19. The module of claim 1 including additional interconnection means on said supporting means for interconnection of said module with other modules.

* * * * *

UNITED STATES PATENT AND TRADEMARK OFFICE
CERTIFICATE OF CORRECTION

PATENT NO. : 3,949,274
DATED : April 6, 1976
INVENTOR(S) : Wilhelm Anacker

It is certified that error appears in the above-identified patent and that said Letters Patent are hereby corrected as shown below:

In column 1, Background, line 1, correct the spelling of --years--.

In column 1, line 18, correct the spelling of --constraining--.

In column 2, line 45, correct the spelling of --present--.

In column 4, line 30, delete "108".

In column 9, line 51, change "comprises" to --comprise--.

Signed and Sealed this

Fourteenth Day of September 1976

[SEAL]

Attest:

RUTH C. MASON
Attesting Officer

C. MARSHALL DANN
Commissioner of Patents and Trademarks